United States Patent
Wang

(10) Patent No.: US 8,023,278 B2
(45) Date of Patent: Sep. 20, 2011

(54) CIRCUIT BOARD

(75) Inventor: Ching-Jen Wang, Taipei (TW)

(73) Assignee: Asustek Computer Inc., Taipei (TW)

( * ) Notice: Subject to any disclaimer, the term of this patent is extended or adjusted under 35 U.S.C. 154(b) by 798 days.

(21) Appl. No.: 12/120,304

(22) Filed: May 14, 2008

(65) Prior Publication Data

US 2008/0304243 A1    Dec. 11, 2008

(51) Int. Cl.
*H05K 7/00* (2006.01)
*H05K 1/18* (2006.01)
*H05K 1/03* (2006.01)
*H05K 1/11* (2006.01)

(52) U.S. Cl. ........ 361/760; 361/761; 361/762; 361/764; 361/780; 361/783; 174/255; 174/260

(58) Field of Classification Search .......... None
See application file for complete search history.

(56) References Cited

U.S. PATENT DOCUMENTS

| | | | | |
|---|---|---|---|---|
| 5,727,221 A | * | 3/1998 | Walsh et al. | 713/310 |
| 6,178,093 B1 | * | 1/2001 | Bhatt et al. | 361/795 |
| 6,203,333 B1 | * | 3/2001 | Medina et al. | 439/76.1 |
| 6,441,313 B1 | * | 8/2002 | Novak | 174/255 |
| 7,127,003 B2 | * | 10/2006 | Rajan et al. | 375/286 |

* cited by examiner

*Primary Examiner* — Boris L Chervinsky
(74) *Attorney, Agent, or Firm* — Birch, Stewart, Kolasch & Birch, LLP

(57) ABSTRACT

A circuit board includes a plurality of conductive layers, a plurality of insulating layers, a telecommunication network connection port and a modem card processing module. A high voltage signal line is laid out at one of the conductive layers. The insulating layers are disposed between each of the conducting layers, respectively. The telecommunication network connection port is disposed on the conductive layers and is electrically connected to one end of the high voltage signal line. The modem card processing module is disposed on the conductive layers and is electrically connected to the other end of the high voltage signal line.

9 Claims, 3 Drawing Sheets

CIRCUIT BOARD

CROSS REFERENCE TO RELATED APPLICATIONS

This Non-provisional application claims priority under 35 U.S.C. §119(a) on Patent Application No(s). 096120884 filed in Taiwan, Republic of China on Jun. 8, 2007, the entire contents of which are hereby incorporated by reference.

BACKGROUND OF THE INVENTION

1. Field of Invention

The invention relates to a circuit board and, more particularly, to a circuit hoard with a telecommunication network connection port.

2. Related Art

With the development of the science and technology, the electronic device is developed toward integration and minimization. The size of the circuit board of the electronic device is reduced, and many function modules such as a circuit board module having a function of modem card should be integrated.

As shown in FIG. 1, taking a conventional motherboard 1 as example, the motherboard 1 includes a telecommunication network connection port 11, a modem card processing module 12 and a signal connection wire 13. The telecommunication network connection port 11 and the modem card processing module 12 are disposed at the surface of a circuit board 10. A telecommunication network plug (not shown) connected to the telecommunication network voltage (TNV) circuit may be inserted into the telecommunication network connection port 11. The signal connection wire 13 is electrically connected to the telecommunication network connection port 11 and the modem card processing module 12, and therefore, the modem card processing module 12 may communicate with the TNV circuit.

The circuit board 10 includes a plurality of conductive layers, and a plurality of signal lines are laid out at each conductive layer, respectively. The external signal connection wire 13 is connected to the telecommunication network connection port 11. The modem card processing module 12 may be fixed on a circuit board. Since the quality of the early modem card processing module 12 is unstable, the modem card processing module 12 is usually fixed on the circuit board in a locking mode to be repaired and replaced conveniently.

In addition, the TNV of each country is different, and some TNV is hazardous voltage whose peak value exceeds forty-two volts called high voltage signal instead of safety extra-low voltage. Some signals transmitted by the telecommunication network connection port 11 are high voltage signals. As a result, to prevent the signal connection wire 13 transmitting the high voltage signals from interfering with the low voltage signal line laid out on the circuit board, the signal connection wire 13 is coated with insulating material, and an iron core 14 is jacketed on the signal connection wire 13. The problem that the lines have electromagnetic radiation interference (EMI) because of the wiring passing the high speed line signal area and the high frequency noise coupled to the connection wire is solved. However, the wire and insulated material of the signal connection wire 13 and the iron core 14 increase the manufacture cost of the circuit board 10. The modem card processing module 12 is fixed it the motherboard in a locking mode, which also costs the manufacture cost.

SUMMARY OF THE INVENTION

The objective of the invention is to provide a circuit board integrated with a high voltage wiring, and the circuit board avoids the interference between the wirings and decreases electromagnetic radiation and manufacture cost.

To obtain the above objective, the invention provides a circuit board including a plurality of conductive layers, a plurality of insulating layers, a telecommunication network connection port and a modem card processing module. A high voltage signal line is laid out at one of the conductive layers. The insulating layers are disposed between each of the conductive layers, respectively. The telecommunication network connection port is disposed on the conductive layer and is electrically connected to one end of the high voltage signal line. The modem card processing module is on the same conductive layer and is electrically connected to the other end of the high voltage signal line.

In a circuit board of a preferred embodiment of the invention, the high voltage signal line is laid out at the top conductive layer. The low voltage signal line and the high voltage signal line are laid out in the same conductive layer. The common low voltage signal line and the high voltage signal line are more than two millimeter apart. In addition, the circuit board further includes a solder mask disposed at the surface of the top conductive layer. The telecommunication network connection port is used for connecting a TNV circuit. The level of the signals transmitted by the high voltage signal line is common TNV.

From the above, in the circuit board of the invention, the high voltage signal line may be directly laid out at the top conductive layer of the circuit board. The insulating layers in the circuit board are used to insulate the high voltage signal line and the wirings of other conductive layers. Compared with the conventional technology, the wiring design of the invention utilizes the material characteristic of the circuit board and the change of the wring layout, and therefore, the cost of the connection wire and the insulating material is saved, the circuit board may be manufactured with a lower cost, and the EMI for the wirings is avoided.

These and other features, aspects, and advantages of the present invention will become better understood with regard to the following description, appended claims, and accompanying drawings.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
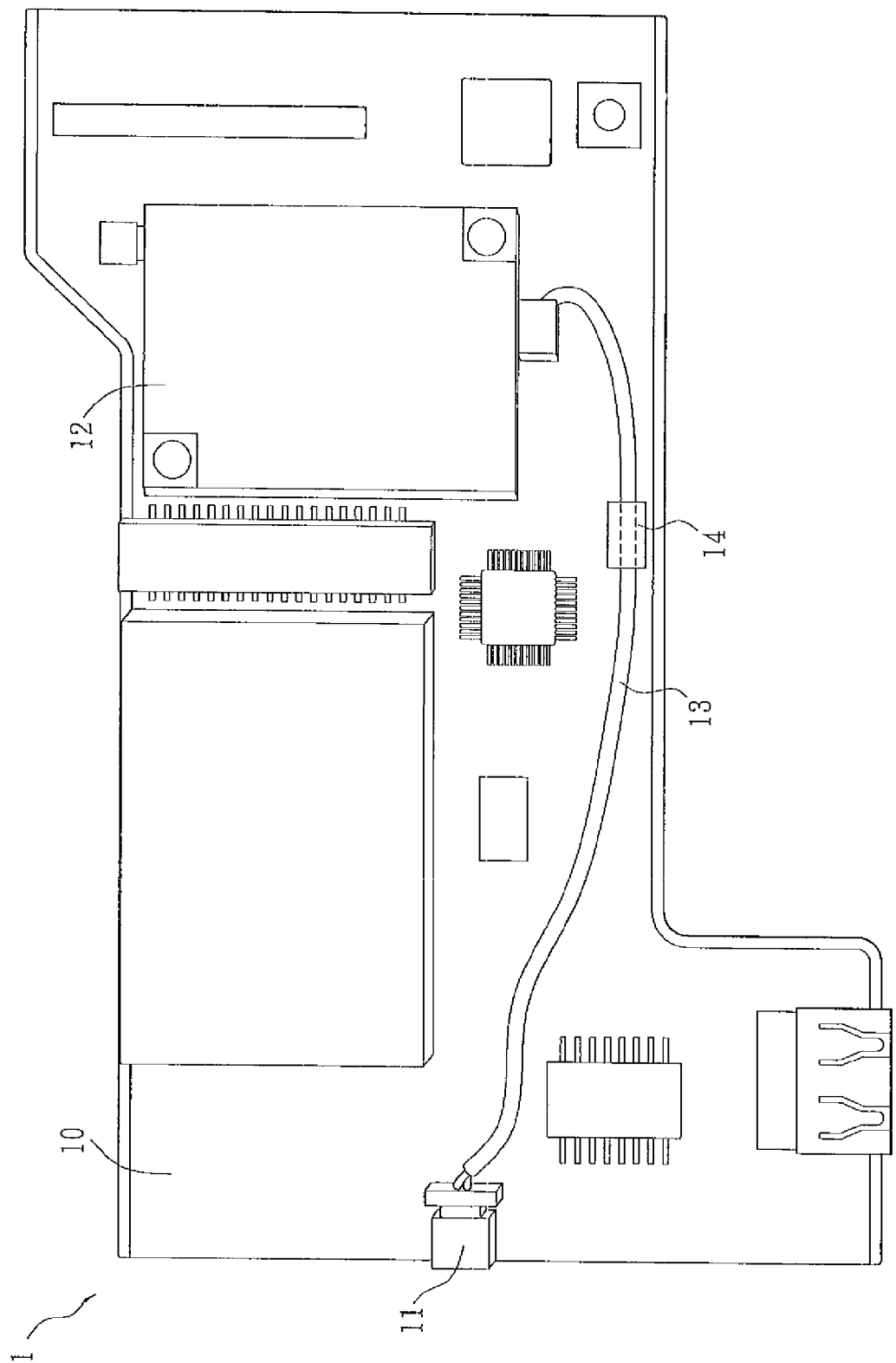
FIG. 1 is a schematic diagram showing a conventional circuit board.
Figure 2:
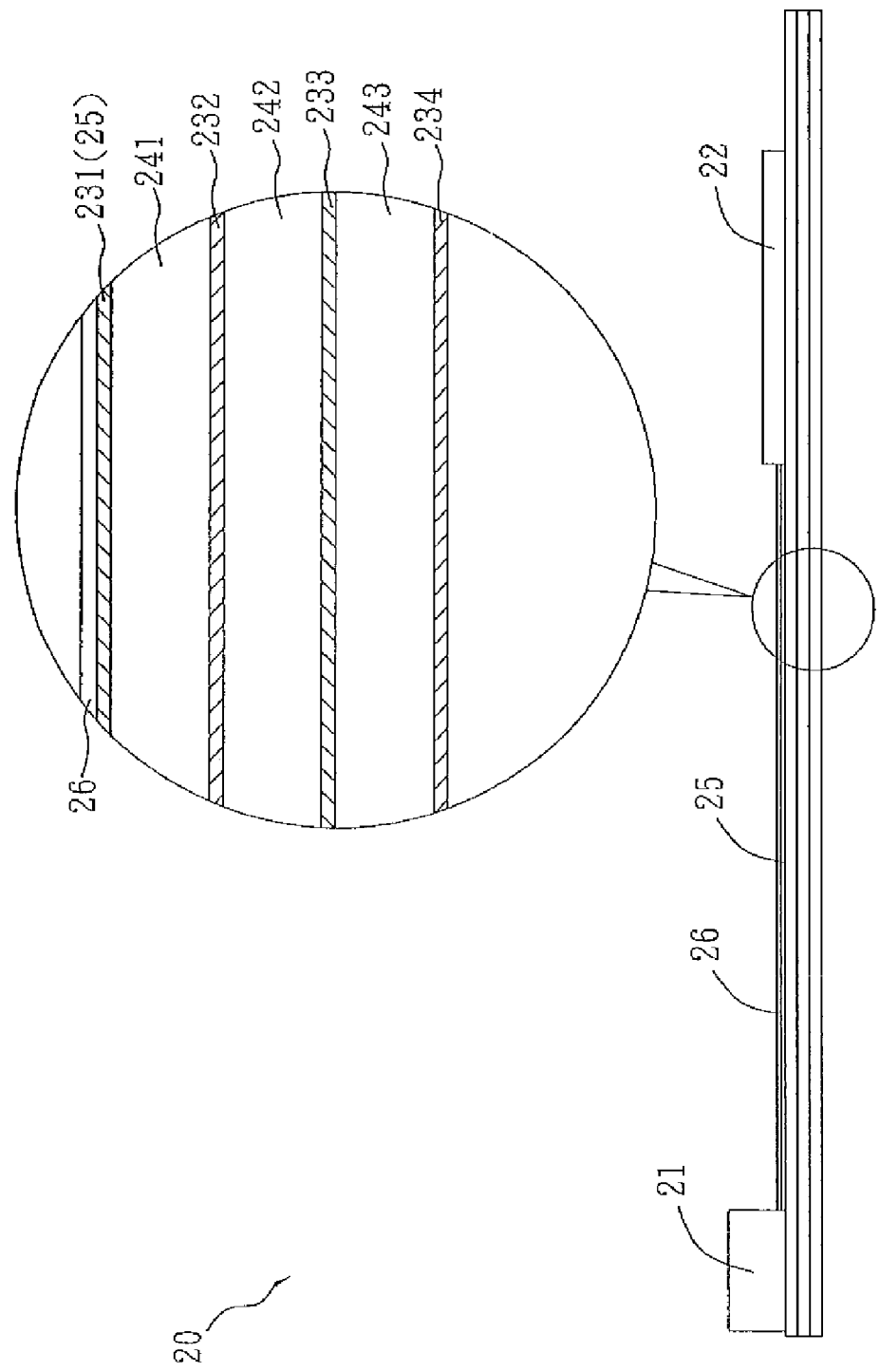
FIG. 2 and FIG. 3 are schematic diagrams showing a circuit board of a preferred embodiment of the invention.

As shown in FIG. 2, a circuit board 20 of the preferred embodiment of the invention includes a plurality of conductive layers 231 to 234, a plurality of insulating layers 241 to 243, a telecommunication network connection port 21 and a modem card processing module 22. The insulating layers 241 to 243 are disposed between each of the conductive layers 231 to 234, respectively, to insulate the wirings of the conductive layers 231 to 234. Usually, the insulating layers 241 to 243 have a certain thickness stack. A solder mask 26 may cover the surface of the top conductive layer 231 to prevent the wiring from contacting the air and being oxidized A high voltage signal line 25 is laid out at one of the conductive layers 231 to 234. The telecommunication network connection port 21 is disposed on the conductive layer 231 and is electrically connected to one end of the high voltage signal line 25. The modem card processing module 22 is disposed on the conductive layer 231 and is electrically connected to the other end of the high voltage signal line 25. In the embodiment, the modem card processing module 22 includes a modem chip.

In the embodiment, the wiring of the top conductive layer 231 does not completely cover the top insulating layer 241. Therefore, the telecommunication network connection port 21 and the modem card processing module 22 may be disposed on the conductive layer 231 without the wiring.

The high voltage signal line 25 is laid out at the top conductive layer 231, and the insulating layer 241 of the circuit board 20 is utilized to prevent the high voltage signal line 25 from being coupled to the wiring of the conductive layer 232. In addition, the two ends of the high voltage signal line 25 may be connected to the telecommunication network connection port 21 and the modem card processing module 22 easily. The electrical connection may be achieved by layout of the wiring or in other manners. If the high voltage signal line 25 is laid out at other conductive layer, a conductive plug or a conductive via should be disposed at the circuit board 20 to connect the high voltage signal line 25 and the telecommunication network connection port 21 or to connect the high voltage signal line 25 and the modem card processing module 22. A proper spatial distance should be formed between layers having the conductive via to prevent the high voltage signal from interfering the low voltage signal.

The telecommunication network connection port 21 is used to be connected to a TNV circuit, and the level of the signals transmitted by the high voltage signal line 25 varies with the location.

Generally speaking, the TNV circuit is a secondary circuit. Some TNV circuits having the hazardous voltage whose peak value excesses 42.4 volts or whose direct current is greater than 60 volts is called high voltage signal line.

Figure 3:
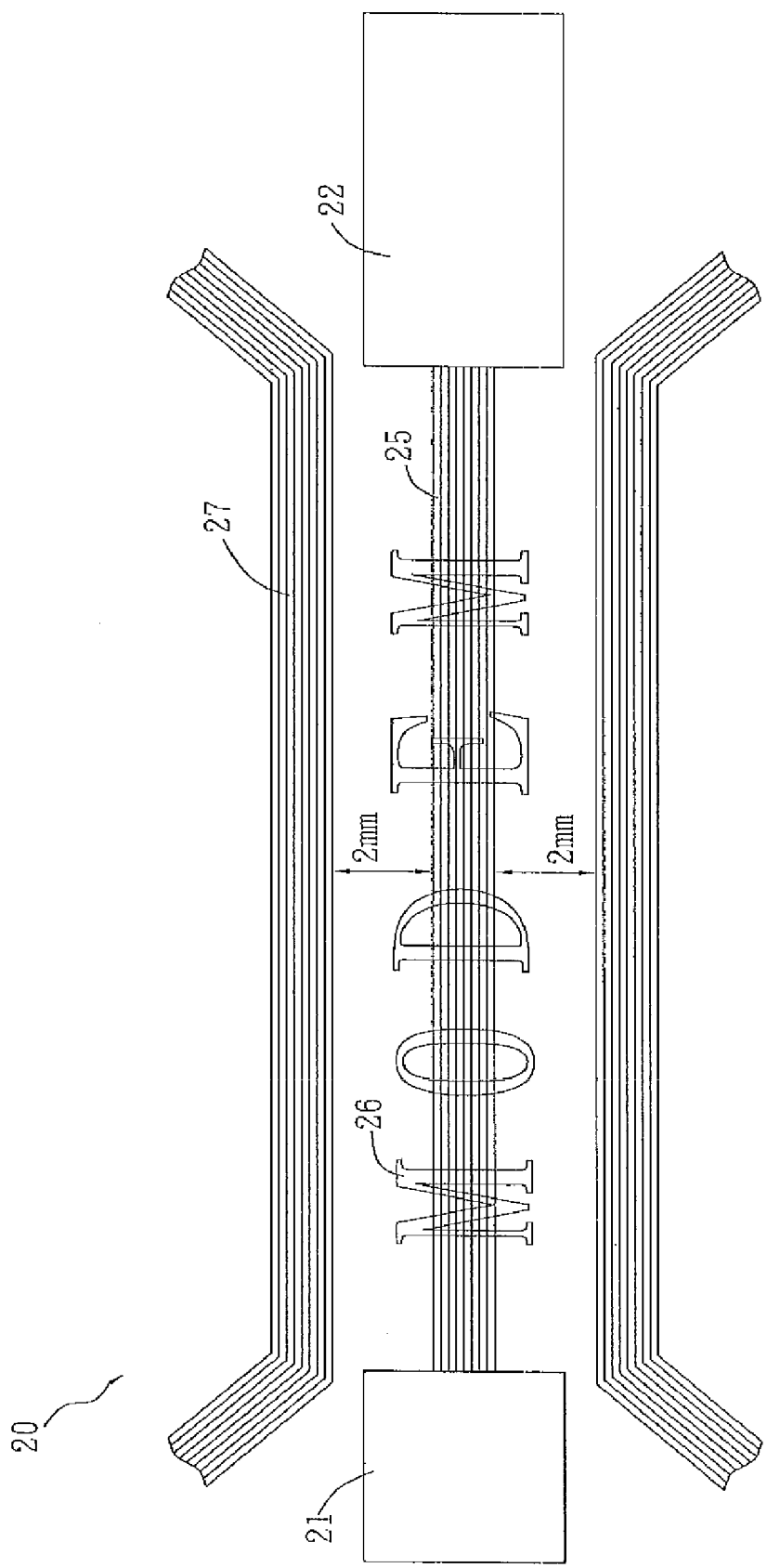

FIG. 3 is the top view showing the circuit board shown in FIG. 2. The low voltage signal line 27 and the high voltage signal line 25 are laid out at the same conductive layer 231. The level of the signals transmitted by the low voltage signal line 27 is the common operation voltage of the circuit board 20. The voltage level thereof is lower than that of the signal transmitted by the high voltage signal line 25. The voltage thereof is usually about 5 volts, 3.3 volts or other low voltage.

The low voltage signal line 27 and the high voltage signal line 25 are at least two millimeters apart to prevent the high voltage signal line 25 from interfering with the low voltage signal line 27. If both the layout area and the insulating effect are considered, the space like distance between the low voltage signal line 27 and the high voltage line 25 may property increase.

In addition, the surface of the circuit board 20 further has a solder mask 26 called green paint in the field. The solder mask 26 is disposed at the top conductive layer 231 and the insulating layer 241 in a printing or coating mode. The solder mask 26 not only can prevent the circuit board from being oxidized as dielectric material, but also may prevent users or other elements from contacting the high voltage signal line 25 as insulating material. The location of the high voltage signal line 25 may be marked at the surface of the solder mask 26 to remind users not to touch the wiring.

The circuit board 20 is a motherboard. The modem card processing module 22 may be a modulating or demodulating circuit. The modem card processing module 22 includes electronic elements such as capacitors, inductors, transistors and chips. The electronic elements are disposed at the top conductive layer 231 and are electrically connected to the conductive layer 231 according to the disposition of the wiring. After the signals inputted from the telecommunication network connection port 21 are processed by the modem card processing module 22, they are transmitted to other processing circuit or electric device via the wiring laid out at the conductive layer.

In the embodiment, the circuit board 20 is a four-layer circuit board. However, the number of the conductive layers is not limited to be four layers, two layers, six layers, and eight layers, and other layers are also within the scope of the invention.

To sum up, in the circuit board of the invention, the high voltage signal line is directly laid out at the conductive layer of the circuit board, and the insulating layer of the circuit board is utilized to insulate the high voltage signal line and wirings of other conductive layers. Compared with the conventional technology, the wiring design of the invention utilizes the material characteristic of the circuit board and the change of the wiring layout. Therefore, the cost of the connection wire and the insulating material is saved, the circuit board may be manufactured with a low cost, and the EMI for the wirings is avoided.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A circuit board comprising:
   a plurality of conductive layers, wherein a high voltage signal line is laid out at one of the conductive layers;
   a plurality of insulating layers disposed between each of the conductive layers, respectively;
   a telecommunication network connection port disposed on the conductive layers and electrically connected to one end of the high voltage signal line; and
   a modem card processing module disposed on the conductive layers and electrically connected to the other end of the high voltage signal line.

2. The circuit board according to claim 1, wherein the high voltage signal line is laid out at the top conductive layer.

3. The circuit board according to claim 2, further comprising:
   a solder mask disposed on the high voltage signal line.

4. The circuit board according to claim 1, further comprising:
   a low voltage signal line, wherein when the low voltage signal line is laid out at the same conductive layer with the high voltage signal line, the high voltage signal line and the low voltage signal line are at least two millimeters apart.

5. The circuit board according to claim 1, wherein the modem card processing module comprises a modem chip.

6. The circuit board according to claim 1, wherein the telecommunication network connection port is connected to a telecommunication network voltage circuit.

7. The circuit board according to claim 1, wherein the level of the signals transmitted by the high voltage signal line is the voltage whose peak value excesses 42.4 volts.

8. The circuit board according to claim 1, wherein the level of the signals transmitted by the high voltage signal line is the voltage whose direct current is greater than 60 volts.

9. The circuit board according to claim 1, wherein the circuit board is a motherboard.

* * * * *